(12) United States Patent
Hasegawa

(10) Patent No.: US 7,352,475 B2
(45) Date of Patent: Apr. 1, 2008

(54) MEASURING METHOD AND APPARATUS USING SHEARING INTERFEROMETRY, EXPOSURE METHOD AND APPARATUS USING THE SAME, AND DEVICE MANUFACTURING METHOD

(75) Inventor: Masanobu Hasegawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 382 days.

(21) Appl. No.: 10/994,314

(22) Filed: Nov. 23, 2004

(65) Prior Publication Data

US 2005/0117170 A1 Jun. 2, 2005

(30) Foreign Application Priority Data

Nov. 28, 2003 (JP) ............................. 2003-398722

(51) Int. Cl.
*G01B 11/02* (2006.01)

(52) U.S. Cl. .................. 356/515; 356/520; 356/521

(58) Field of Classification Search ................ 356/124, 356/515, 520, 521
See application file for complete search history.

(56) References Cited

U.S. PATENT DOCUMENTS

| | | | |
|---|---|---|---|
| 5,291,023 A | 3/1994 | Hasegawa et al. | 250/548 |
| 5,313,272 A | 5/1994 | Nose et al. | 356/375 |
| 5,396,335 A | 3/1995 | Hasegawa et al. | 356/401 |
| 5,495,336 A | 2/1996 | Nose et al. | 356/375 |
| 5,717,492 A | 2/1998 | Sentoku et al. | 356/401 |
| 5,726,758 A | 3/1998 | Hasegawa et al. | 356/401 |
| 5,750,294 A | 5/1998 | Hasegawa et al. | 430/22 |
| 5,777,744 A | 7/1998 | Yoshii et al. | 356/372 |
| 5,834,767 A | 11/1998 | Hasegawa et al. | 250/237 G |
| 5,969,820 A | 10/1999 | Yoshii et al. | 356/375 |
| 6,040,909 A | 3/2000 | Hasegawa et al. | 356/375 |
| 6,124,601 A | 9/2000 | Yoshii et al. | 250/559.29 |
| 6,266,130 B1 | 7/2001 | Hasegawa et al. | 355/53 |
| 6,307,635 B1 * | 10/2001 | Goldberg | 356/521 |

(Continued)

FOREIGN PATENT DOCUMENTS

DE 102 60 985 A1 5/2004

(Continued)

OTHER PUBLICATIONS

Lee, S. H., et al., "Extreme ultraviolet holographic microscopy and its application to extreme ultraviolet mask-blank defect characterization," *J. Vac. Sci. Technol.*, B 18(6), Nov./Dec. 2000. pp. 2935-2938.

(Continued)

*Primary Examiner*—Tarifur Chowdhury
*Assistant Examiner*—Jonathan M Hansen
(74) *Attorney, Agent, or Firm*—Fitzpatrick, Cella, Harper & Scinto

(57) ABSTRACT

A measuring apparatus for irradiating measuring light and for measuring optical performance of a target optical system includes a barrel for housing the target optical system, the barrel being rotatable around an optical axis of the target optical system, and an illumination optical system for introducing the measuring light into the barrel, the illumination optical system being movable along a direction perpendicular to the optical axis of the target optical system. The measuring apparatus controls an illumination area of the measuring light in the target optical system using a polar coordinate determined by a rotational angle of the barrel and a moving amount of the illumination optical system.

8 Claims, 7 Drawing Sheets

U.S. PATENT DOCUMENTS

| | | | |
|---|---|---|---|
| 6,573,997 B1* | 6/2003 | Goldberg et al. | 356/521 |
| 6,636,311 B1 | 10/2003 | Ina et al. | 356/401 |
| 2004/0174533 A1* | 9/2004 | Nakauchi | 356/515 |
| 2005/0117168 A1* | 6/2005 | Ouchi | 356/520 |
| 2006/0187435 A1* | 8/2006 | Ohsaki | 355/55 |

FOREIGN PATENT DOCUMENTS

| | | |
|---|---|---|
| JP | 2003-86501 | 3/2003 |
| WO | WO 02/12826 A1 | 2/2002 |

OTHER PUBLICATIONS

Naulieau, P. P., et al., "Extreme ultraviolet carrier-frequency shearing interferometry of a lithographic four-mirror optical system," *J. Vac. Sci. Technol.* B 18(6), Nov./Dec. 2000. pp. 2939-2943.

European Search Report dated Mar. 8, 2007, mailed in a Communication dated Mar. 20, 2007, in copending European patent application No. 04 02 8148.

* cited by examiner

PRIOR ART

MEASURING METHOD AND APPARATUS USING SHEARING INTERFEROMETRY, EXPOSURE METHOD AND APPARATUS USING THE SAME, AND DEVICE MANUFACTURING METHOD

BACKGROUND OF THE INVENTION

The present invention relates generally to a manufacturing method and apparatus, and, more particularly, to a measuring method and apparatus that use shearing interferometry to measure a wave front aberration of a target optical system, such as a projection optical system that transfers a mask pattern onto an object, and an exposure method and apparatus using the measuring method and apparatus. The inventive measuring method and apparatus are suitable, for example, for measurement of a projection optical system in an exposure apparatus that utilizes extreme ultraviolet ("EUV") light.

A projection exposure apparatus is used to transfer a pattern on a mask (or a reticle) onto an object to be exposed in manufacturing semiconductor devices, for example, in a photolithography process. This exposure apparatus is required to transfer the pattern on the reticle onto the object precisely at a predetermined magnification. For this purpose, it is important to use a projection optical system having a good imaging performance and reduced aberration. In particular, due the to the recent demands for finer processing of semiconductor devices, a transferred pattern is more sensitive to the aberration of the optical system. Therefore, there is a demand to measure the wave front aberration of the projection optical system with high precision.

A shearing interfering system is conventionally known as a method for measuring a wave front aberration of a projection optical system. FIG. 4 shows a basic arrangement of the conventional shearing interfering system. A pinhole plate 1 is arranged at a desired object point on the object surface of a target optical system 2. Since the pinhole plate 1 should efficiently shield the EUV light, it is made, for example, of Ta or Ni. A thickness of the pinhole plate 1 is 200 nm or larger for Ta and 150 nm or larger for Ni. A diameter of the pinhole A should be $\lambda/2$ NAi, where NAi is a numerical aperture of the target optical system 2 at the side of the illumination optical system. An image of the pinhole A is formed on a diffracted light selecting window plate 4 provided on the image surface under the influence of the aberration of the target optical system 2. A diffracting grating plate 6 is arranged between the target optical system 2 and the diffracted light selecting window plate 4 that has diffracted light selecting windows D and E.

In calculating a wave front using the shearing interferometry, wave front information obtained in two orthogonal directions, for example, the x and y directions, is synthesized. More specifically, a two-dimensional wave front restoration method using two diffraction gratings having orthogonal periodic directions is known, which includes the steps of, obtaining wave front information in the x direction from x shearing wave front data obtained by offsetting or shearing a wave front in the x direction, obtaining wave front information in the y direction from y shearing wave front data obtained by offsetting or shearing a wave front in the y direction, and conducting path integrals in the x and y directions. FIG. 4 uses a combination of the pinhole A, the diffraction grating B and the diffracted light selecting window D to measure the shearing wave front in the x direction, and a combination of the pinhole A, the diffraction grating C and the diffracted light selecting window E to measure the shearing wave front in the y direction. The pinhole A is arranged in the measurement point. In measuring the wave front in the x direction, the diffraction grating B and window D are arranged in the optical path. A stage (not shown), for holding the diffraction gratings B and C and the windows D and E, is driven to exchange the diffraction grating and the window.

In order to measure the wave front in the x direction, a spherical wave emitted from the pinhole A passes the target optical system 2, is divided into plural wave fronts of plural order diffracted lights by the diffraction grating, and enters the window D. The window size is designed so that the ±1st order diffracted lights pass the centers of the windows D and E. In other words, a light shielding part around the window D shields unnecessary 0th and other orders of diffracted lights, and a CCD 4 observes high contrast interference fringes resulting from the ±1st order lights. The wave front is sheared by a separation interval between the ±1st order lights on the observed surface 5, which is about $\frac{1}{30}$ to $\frac{1}{60}$ of the NA. The measurement of the wave front in the y direction is similar to that in the x direction, although the measurement direction rotates by 90°.

A method that uses a two-dimensional diffraction grating has conventionally been proposed (see, for example, Patrick P. Naulleau and Kennet A. Goldberg, "Extreme ultraviolet holographic microscopy and its application to extreme ultraviolet mask-blank defect characterization," J. Vac. Sci. Technol. B18(6), (2000), (simply referred to as the "EUV article" hereinafter), which Fourier-transforms interference fringes including many mixed diffracted lights, and extracts signal light components of the ±1st order lights through signal processing.

The interferometer shown in FIG. 4 uses two orthogonal diffraction gratings, obtains the wave front information in the x direction from the x shearing wave front data and the wave front information in the y direction from the y shearing wave front data, conducts a path integral in the x and y directions, and restores the two-dimensional wave front. However, this interferometer has a problem shown in FIG. 5. Here, FIG. 5 is an optical-path diagram for explaining the problem of the system shown in FIG. 4. The wave front measurements in the y direction follow the wave front measurements in the x direction. Therefore, the above problem occurs when a position in the optical-axis direction (or z direction) offsets from F to G in FIG. 5 due to driving errors of the stage, influence of the vibration, etc., during a replacement of the diffraction grating from B to C.

The diffraction grating located at the position F causes the wave front to diffract at H and to image at a position J. On the other hand, the diffraction grating located at a position G causes the wave front to diffract at I and to image at a position K. Since a segment HJ is parallel to a segment IK, $\Delta J = \Delta F \cdot \tan \theta$ is met, where $\Delta J$ is a shift amount of the position J at which the 1st order light condenses when a position of z of the diffraction grating varies by $\Delta F$ from F to G, and $\theta$ is a diffraction angle of the first order light. Since this shift similarly happens to the −1st order light, an interval between the ±1st order lights on the imaging surface varies by $2\Delta F \cdot \tan \theta$. This offset appears as a tilt fringe in the wave front component. Since the shearing interferometer directly observes the diferentiated wave front, the tilt component is observed as a defocus component as a result of integration in the shearing direction. In this case, the focus component of the wave front data in the xy components includes an offset due to $2\Delta F \cdot \tan \theta$, and this offset is finally measured as astigmatism. One design example needs to maintain $\Delta F$ to be about 10 nm in order to reduce the astigmatism error down to 0.1 nm RMS or smaller, and it is extremely difficult to control two physically different grating surfaces in such a range.

The EUV article discusses avoiding this problem, but causes new problems of inevitable optical contrast deteriorations in the signal component, and extremely complex signal processing.

Accordingly, it is an illustrative object of the present invention to provide a measuring method and apparatus which utilize the shearing interferometry and provide higher precision and easier signal processing than does the conventional method, an exposure method and apparatus using them, and a device manufacturing method.

A measuring apparatus according to one aspect of the present invention includes a first mask having a pinhole for generating a spherical wave as measuring light, a second mask provided subsequent to the first mask in a light traveling direction, the second mask having a selecting window that allows the measuring light that has passed a target optical system to transmit through the selecting window, and a two-dimensional light divider, located between the first and second masks, for two-dimensionally dividing light, wherein the measuring apparatus calculates optical performance of the target optical system from an interference fringe formed by the measuring light that has passed the selecting window. The optical performance may be a wave front aberration. The measuring apparatus may calculate the optical performance from wave front aberration of the target optical system with respect to two orthogonal directions, wherein the selecting window in the second mask allows ±1st order diffracted lights of the measuring light in one or both of the two orthogonal directions to simultaneously pass through the selecting window.

A measuring method according to another aspect of the present invention includes the steps of dividing measuring light using a two-dimensional divider, obtaining interference information with respect to the two orthogonal directions, through a shearing interference between predetermined orders of the measuring lights that have passed a target optical system, a position of the two-dimensional divider being fixed during the obtaining step, the obtaining step using a selecting window plate that has at least two windows aligned with one direction of the two orthogonal directions, and calculating optical performance of the target optical system by integrating the interference information, and by using the interference information of the measuring light that has passed the selecting window plate.

A measuring method according to still another aspect of the present invention includes the steps of dividing measuring light using a two-dimensional divider, obtaining interference information with respect to two orthogonal directions, through an interference between predetermined orders of the measuring lights that have passed a target optical system, a position of the two-dimensional divider being fixed during the obtaining step, the obtaining step using a selecting window plate that has two pairs of windows aligned with the two orthogonal directions, and calculating optical performance of the target optical system by Fourier-transforming the interference information, by performing spatial frequency filtering for a component of an interference fringe generated by a combination of predetermined openings so as to selectively extract the component, and by using the interference information of the measuring light that has passed the selecting window plate.

An exposure method according to one aspect of the present invention includes the steps of calculating optical performance of a target optical system using the above measuring method, adjusting the target optical system based on the optical performance of the target optical system, which is calculated by the calculating step, and exposing an object using the target optical system adjusted by the adjusting step.

An exposure apparatus according to another aspect of the present invention for exposing a pattern on a mask onto an object using light includes a projection optical system for projecting the pattern onto the object, and the above measuring apparatus for detecting a wave front aberration of the projection optical system. The light may have a wavelength of 20 nm or less.

A device manufacturing method according to another aspect of the present invention includes the steps of exposing an object to be exposed using the above exposure apparatus, and developing the object exposed. Claims for a device fabricating method for performing operations similar to that of the above exposure apparatus cover devices as intermediate and final products. Such devices include semiconductor chips, such as LSIs and VLSIs, CCDs, LCDs, magnetic sensors, thin film magnetic heads, and the like.

Other objects and further features of the present invention will become readily apparent from the following description of the preferred embodiments with reference to the accompanying drawings.

DETAILED DESCRIPTION OF THE PREFERRED EMBODIMENTS

Figure 1:
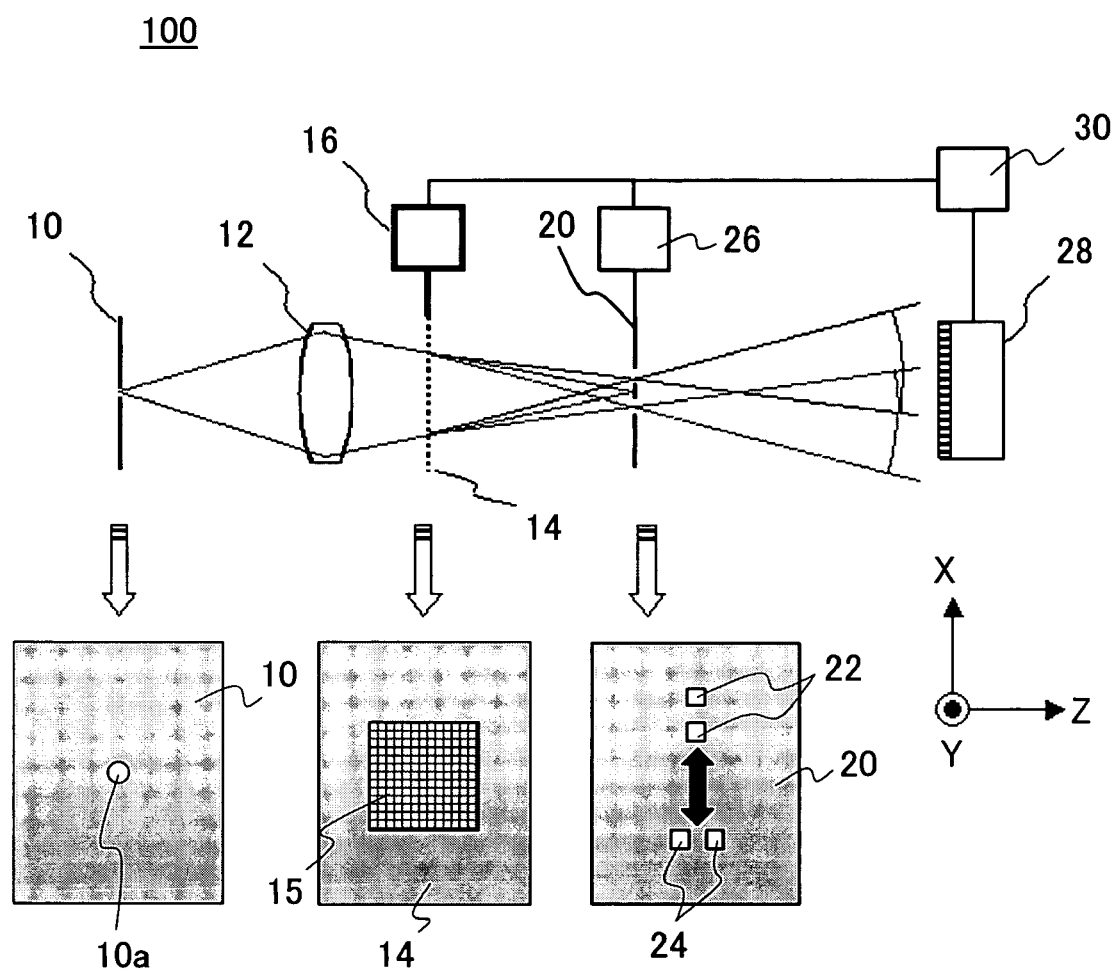
FIG. 1 is an optical-path diagram of a measuring apparatus according to one embodiment of the present invention.

FIG. 1 shows a basic arrangement of the measuring apparatus 100 according to one embodiment of the present invention. The measuring apparatus 100 includes a pinhole plate 10, a target optical system 12, a diffraction grating 14, a stage 16 for the diffraction grating 14, a selecting window plate 20, a stage 26 for the selecting window plate 20, a detector 28, and a controller 30. While FIG. 1 shows the target optical system 12 as a lens, it is a reflection optical system when the exposure apparatus uses the EUV light as a light source.

The pinhole plate 10 has a pinhole 10a that generates a spherical wave that serves as the measurement light, and is arranged at a desired measurement point on the object surface of the target optical system 12. In an EUV exposure optical system having an NA of 0.25, the NA at the illumination optical system side is about 0.0625, and a diameter of the pinhole 10 a is 13.5/(2×0.0625)=108 nm to cover this range of the diffraction angle. Therefore, the pinhole 10a having about 100 nm is used. The pinhole plate 10 is illuminated by the illumination optical system (not shown). A high-intensity and high-coherence light source is necessary for the pinhole 10a. Ideally, an undulator radiation X-ray that narrows a band of the X-ray generated from the synchrotron radiation is preferably used. The pinhole plate 10 should efficiently shield the EUV light and is made, for example, of Ta and Ni. A thickness of the pinhole plate 1 is 200 nm or larger for Ta and 150 nm or larger for Ni.

The illumination light emitted as a spherical wave from the pinhole 10a passes the target optical system 12 and images on the diffracted light selecting window plate 20. The diffracted light selecting window plate 20 has a pair of identically shaped windows 22 aligned with the x direction and another pair of identically shaped windows 24 aligned with the y direction. The windows 22 are selected for shearing measurements in the x direction, and positioned so that an image is formed at the center between two windows 22.

Figures 2A, 2B:
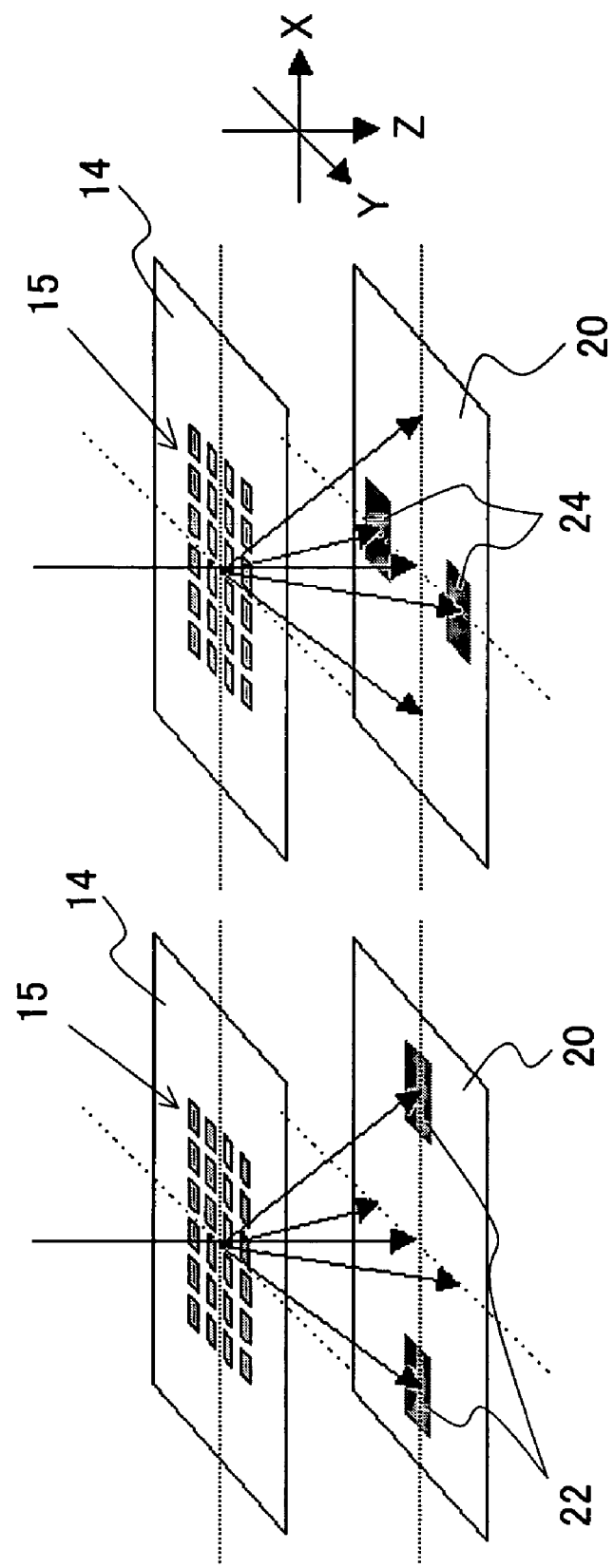
FIGS. 2A and 2B are perspective views of the optical path for explaining operations of selecting windows in the measuring apparatus shown in FIG. 1.

Then, a diffraction grating plate 14 having a two-dimensional diffraction grating 15 is inserted by the stage 16 so that the ±1st order lights can pass two windows (FIG. 2A). While a shearing ratio between the ±1st order lights is determined by a window interval, a distance between the diffraction grating 14 and the diffracted light selecting window plate 20, a spatial frequency necessary for the wave front recovery, and the contrast necessary for the interference fringes, the preferable shearing ratio is 1/30.

For measurements in the y direction, the selecting window plate 20 is driven to position the 0th order light at the center between the two selecting windows 24. Since the windows 22 and 24 are located on the same mask, an interval between the patterns is adjustable using the electron beam imaging speed, such as about 50 nm, for manufacturing the mask. Moreover, the stage 26 for driving the selected window plate 20 has a driving precision of about 0.1 μm, even if employing a normal pulsed motor, and the windows 22 and 24 of the selecting window plate 20 have a width of about 1.3 μm. Therefore, the driving of the stage 26 can provide sufficient precision for positioning.

Figure 4:
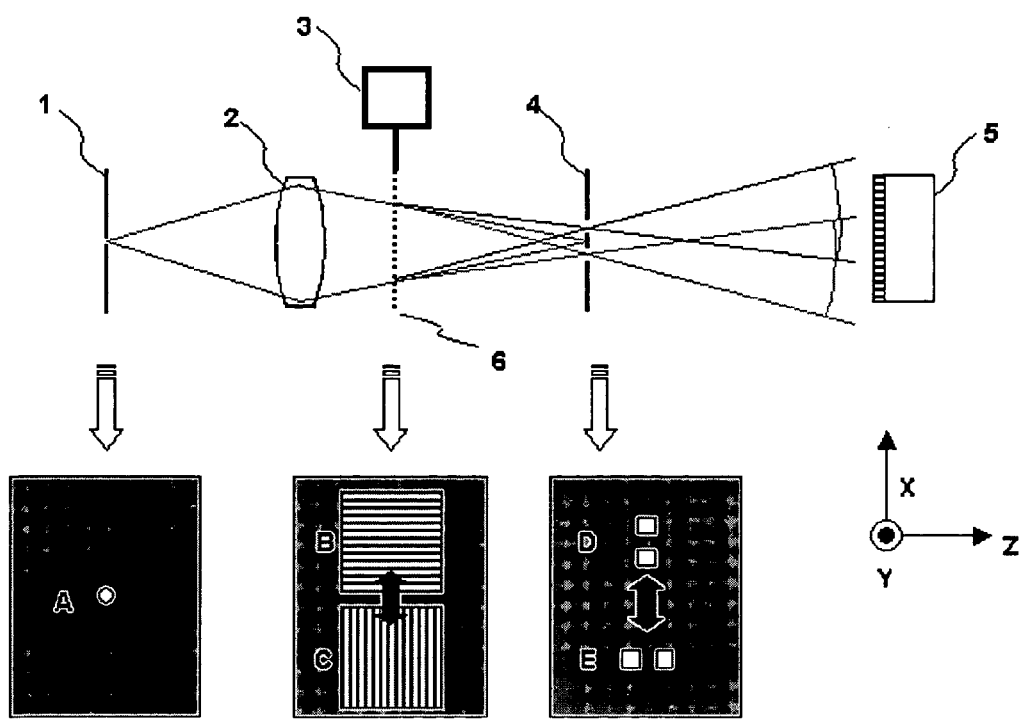
FIG. 4 is an optical-path diagram of a conventional measuring apparatus.

For x and y shearing measurements, the conventional structure shown in FIG. 4 has difficulties spatially according to the diffraction gratings B and C with the same surface when the windows D and E are exchanged and the diffraction grating B for the x measurements is replaced with the diffracting grating C for the y measurements. As a result, the measurement errors occur as described above with reference to FIG. 5. On the other hand, the instant embodiment does not replace the diffracting grating plate 14, although exchanging the selecting window 20, and, thus, maintains highly precise measurements in varying the measurement direction.

Thus, the optical arrangement of the instant embodiment shown in FIG. 1 is distinguished from the one shown in FIG. 4 of the EUV article, in that the instant embodiment changes the diffracting grating from the one-dimensional diffracting gratings B and C to the two-dimensional diffracting grating 15, and includes the selecting window plate 20.

The detector 28 is a detector or camera that serves as interference fringe observer means, such as a backlight type CCD. The controller 30 controls the stages 16 and 26, obtains the shearing interference information detected by the detector 28, conducts the wave front analysis, and calculates the wave front aberration of the target optical system 12.

The wave front can be restored by introducing the same order diffracted lights to the CCD 28 from the selecting windows 22 and 24 in a similar manner. More specifically, the CCD 28 photographs the independently sheared wave fronts in the x and y components. The controller 28 integrates the wave fronts in the shearing direction, and restores the two-dimensional wave front by the path integral. For the improved precision, the interference fringe image is obtained by scanning the grating in the x direction by ¼ pitch during the x shearing time, and the phase information (or wave front) is calculated by the five or nine bucket method. Since the phase information is discrete information every 360°, unwrapping for smooth phase connections provides a highly precise wave front. These are obtained from the differentiated wave front, and the integral operation restores the original wave front.

Figure 3:
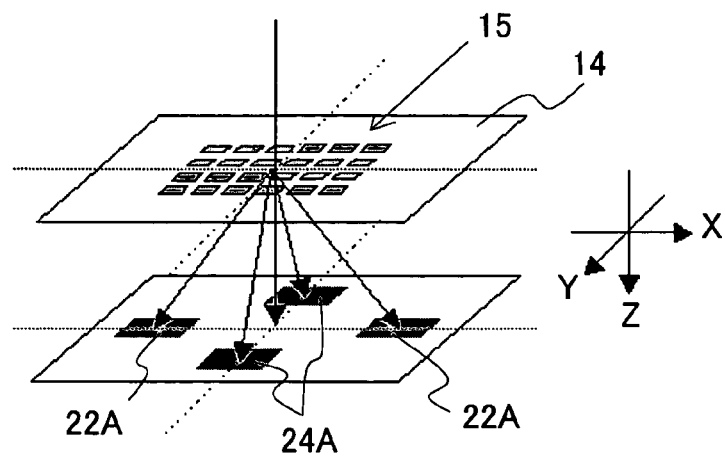
FIG. 3 is a perspective view of the optical path for explaining a variation of a selecting window in the measuring apparatus shown in FIG. 1.
Figure 5:
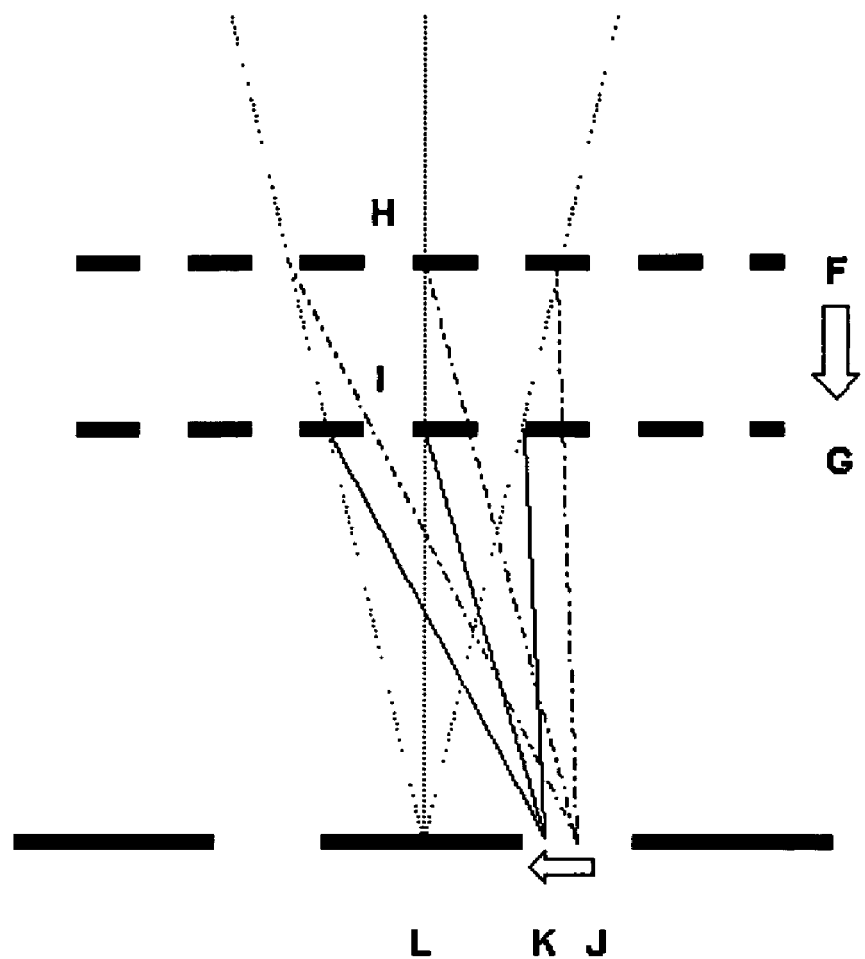
FIG. 5 is an optical-path diagram for explaining a problem of the measuring apparatus shown in FIG. 4.

The above method can remarkably reduce measurement errors, such as a positional error of the diffraction grating shown in FIG. 5, but the diffraction grating itself moves or drifts in the optical-axis direction when x and y components are time-sequentially taken in. The drift during measurement causes slight errors due to the similar principle. One effective solution for this problem is to use the configuration shown in FIG. 3 and to simultaneously measure the x and y components. FIG. 3 provides a selecting window plate 20A with two pairs of windows 22A and 24A in the x and y directions. The windows 22A correspond to the windows 22, and the windows 24A correspond to the windows 24. These two pairs of windows 22A and 24A are arranged at vertexes of a square in FIG. 3.

The wave front restoration procedure may apply almost the similar approach to that discussed in the EUV article, which proposes to two-dimensionally Fourier-transform the interference fringes and filters the result so that the interference spectra of the 0th and 1st order lights remain, because the interference contrast between the 0th and 1st order lights is maximum. Since the instant embodiment uses the ±1st order lights, the filtering leaves twofold spatial frequencies, conducts an inverse Fourier transformation to the result, and extracts the signal component. The interference fringe contrast formed by the ±1st order lights becomes higher by about 10% than the contrast formed by the 0th and ±1st order lights. In addition, the scheme in the EUV article causes the interference fringe between other diffracted orders to deteriorate the signal light contrast. Therefore, the present invention can provide more highly precise measurements than the scheme in the EUV article, because the present invention can obtain higher contrast interference fringes.

Thus, according to the measuring method and apparatus of the instant embodiment, the two-dimensional diffraction grating 15 is fixed when the shearing interference information is obtained in two orthogonal directions, and, therefore, the measurement error caused by a replacement of the diffraction grating does not occur. In addition, unlike the scheme in the EUV article, the instant embodiment calculates the wave front aberration of the target optical system 12 from the shearing interference information directed to the measuring light that has passed through the selecting windows, and facilitates the operation processing because the operation amount is remarkably lower than that in the scheme in the EUV article.

Figure 6:
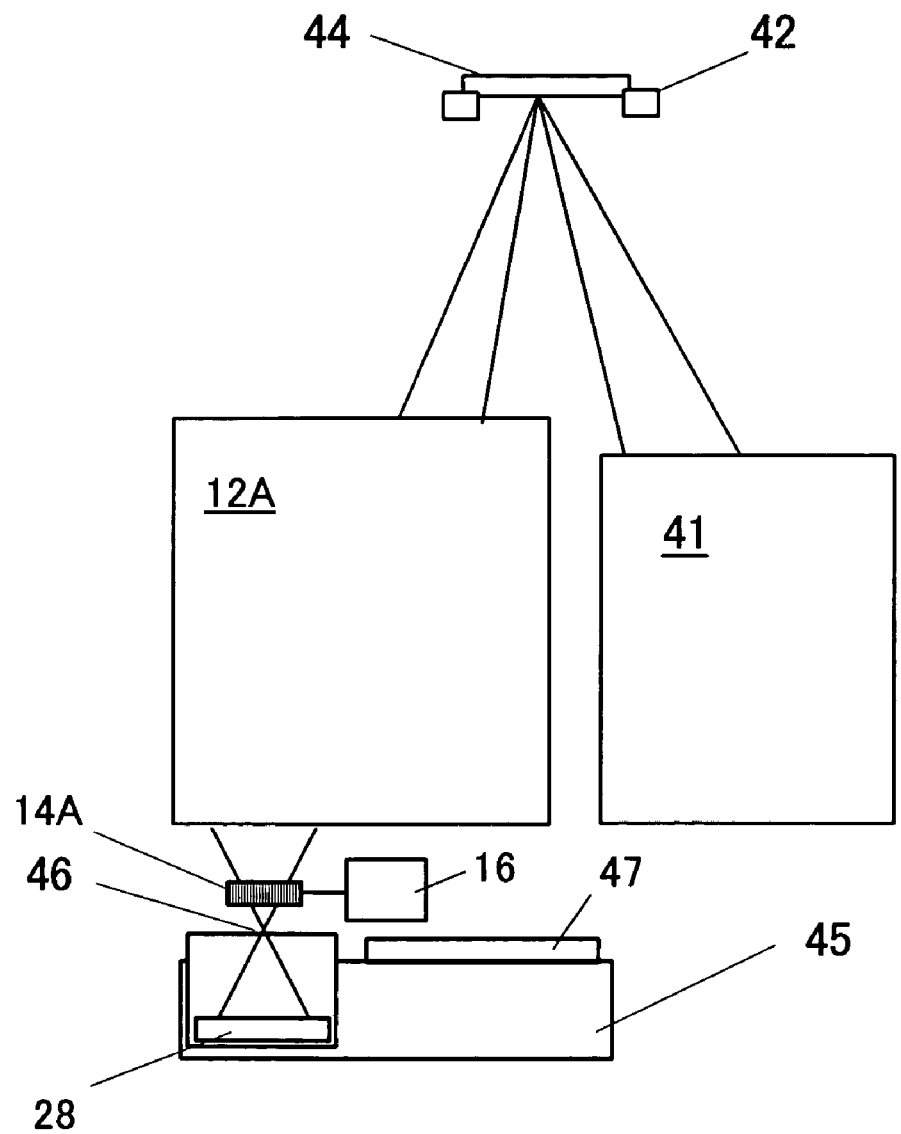
FIG. 6 is an optical-path diagram for explaining an exposure apparatus according to one embodiment of the present invention.

Referring next to FIG. 6, a description will be given of an exposure apparatus 40 according to another embodiment of the present invention. Here, FIG. 6 is a schematic block diagram of the exposure apparatus 40 that utilizes the EUV light as the exposure light, although the inventive exposure apparatus is not limited to the EUV light.

In FIG. 6, reference numeral 41 denotes an illumination optical system including the light source, 42 denotes a reticle stage, and 44 denotes a reticle. The reticle 44 may be the first mask 12 or a reticle that has a circuit pattern of a semiconductor device (e.g., a semiconductor chip, such as ICs and LSIs, a liquid crystal panel, and a CCD). Reference character 12a denotes a projection optical system as a target optical system. Reference numeral 45 denotes a wafer stage. Reference character 14A denotes a diffraction grating plate (or light dividing means). The diffraction grating plate 14A is located at the wafer stage 45 side in FIG. 5, but may be located at the reticle stage 42 side. The diffraction grating plate 14A has a similar structure to the diffraction grating plate 14 shown in FIG. 1. Reference numeral 46 denotes a pattern surface, on which the windows 22 and 24 are arranged. Reference numeral 28 denotes a detector. Reference numeral 47 denotes an object to be exposed, which is a wafer in the instant embodiment. The pattern surface 46 and the detector 28 are integrated with each other and arranged on the wafer stage 45.

In this configuration, similar to that shown in FIG. 1, the illumination optical system 41 illuminates the mask 44, and the diffraction grating 14A divides the wave front that is emitted from the pinhole 10a and is spherical in one direction. The projection optical system 12A shields the 0th order light, and allows the ±1st order diffracted lights to enter the windows 22 (or 22A) and 24 (or 24A), and the detector 28 obtains interference fringes. The interference fringes correspond to a differentiation of the original wave front, and the controller obtains the original wave front information by integrating the interference fringes obtained by the detector 28. For measurements of the aberration characteristics of the projection optical system 12A in the view angle, the phase shift means 16 moves the diffracting grating 14A and the aberrations are similarly measured at several points in the view angle of the projection optical system 12A. This embodiment can easily add an aberration measuring function to the projection exposure apparatus by using a reflection mask pattern.

A description will now be given of an aberration correction method according to one embodiment of the present invention. The exposure apparatus 40 allows plural optical elements (not shown) in the projection optical system to move in the optical-axis direction and/or a direction orthogonal to the optical-axis direction. By driving one or more optical elements using a driving system (not shown) for aberrational adjustments based on aberrational information obtained from the instant embodiment, it is possible to correct or to optimize one or more aberrations of the projection optical system, in particular, Seidel's classification of aberrations. The means for adjusting the aberration of the projection optical system 12A can use various known systems, such as a movable lens, a movable mirror (when the projection optical system is a catadioptric optical system or a full-mirror optical system), an inclinable parallel plate, a pressure-controllable space, and a surface correction using an actuator.

Figure 7:
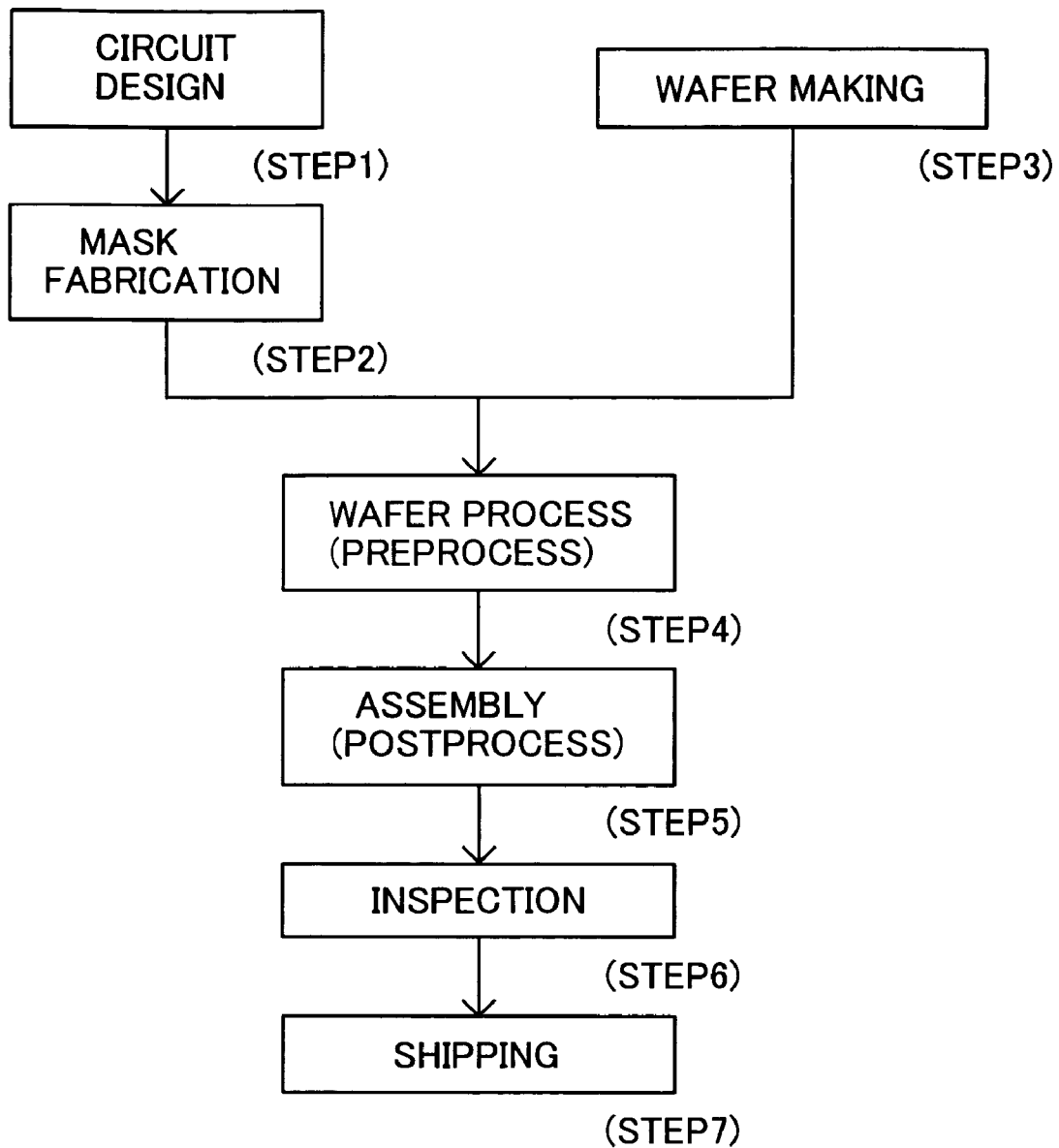
FIG. 7 is a flowchart for explaining a method of fabricating devices (e.g., semiconductor chips such as ICs, LSIs, and the like, LCDs, CCDs, etc.).

A description will now be given of an embodiment of a device manufacturing method using the projection exposure apparatus 40. FIG. 7 is a flowchart for explaining a fabrication of devices (i.e., semiconductor chips such as ICs and LSIs, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 8:
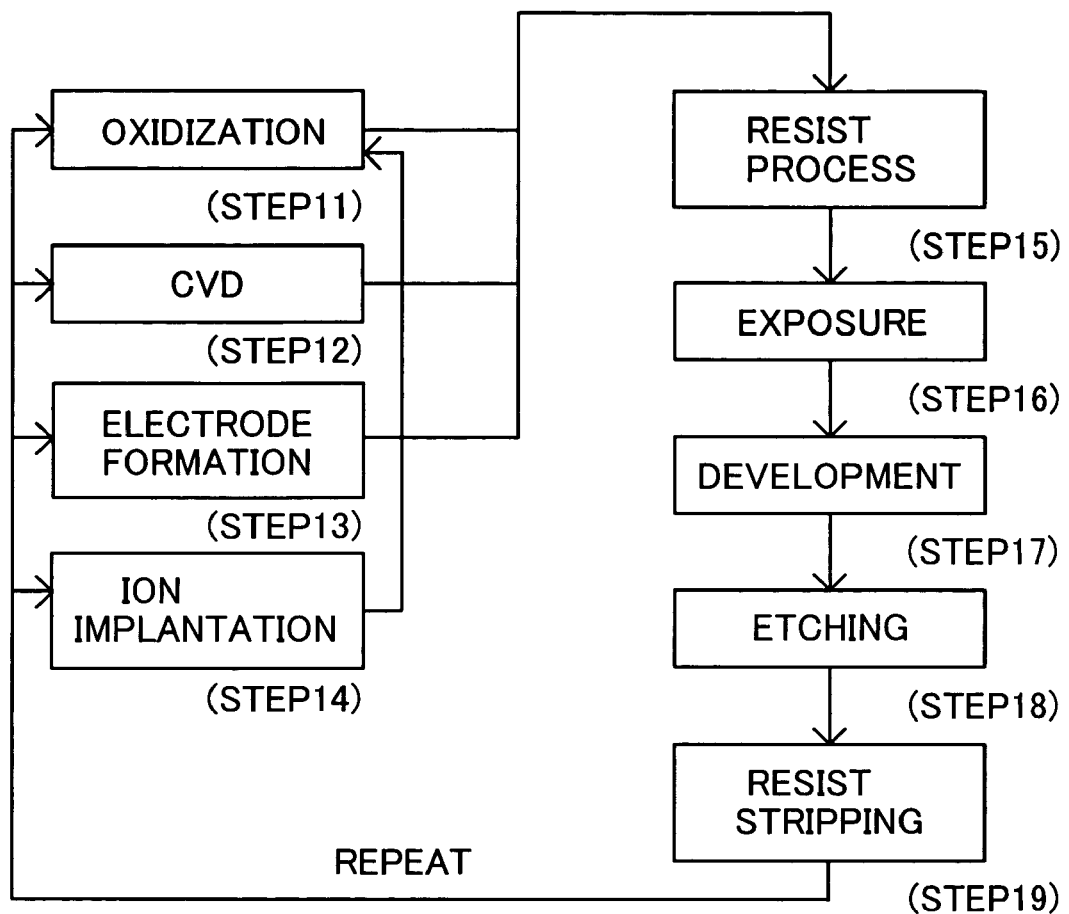
FIG. 8 is a detailed flowchart for Step 4 of the wafer process shown in FIG. 7.

FIG. 8 is a detailed flowchart of the wafer process in Step 4 shown in FIG. 7. Step 11 (oxidation) oxidizes the wafer's surface. Step 12 (CVD) forms an insulating film on the wafer's surface. Step 13 (electrode formation) forms electrodes on the wafer by vapor deposition, and the like. Step 14 (ion implantation) implants ions into the wafer. Step 15 (resist process) applies a photosensitive material onto the wafer. Step 16 (exposure) uses the exposure apparatus 40 to expose a circuit pattern on the mask 42 onto the wafer 47. Step 17 (development) develops the exposed wafer 47. Step 18 (etching) etches parts other than a developed resist image. Step 19 (resist stripping) removes unused resist after etching. These steps are repeated, and multilayer circuit patterns are formed on the wafer 47. The manufacturing method of the present invention can manufacture semiconductor devices, which have been difficult to manufacture, because the wave front aberration has been corrected with high precision.

The present invention thus can provide a measuring method and apparatus which utilize shearing interferometry and provide higher precision and easier signal processing than does the conventional method, an exposure method and apparatus using them, and a device manufacturing method.

While the present invention has been described with reference to what are at present considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims foreign priority based on Japanese Patent Application No. 2003-398722, filed Nov. 28, 2003, which is hereby incorporated by reference herein.

What is claimed is:

1. A measuring apparatus comprising:
a first mask having a pinhole for generating a spherical wave as measuring light;
a second mask provided subsequent to said first mask in a light traveling direction, said second mask having two pairs of selecting windows that allow the measuring light that has passed a target optical system to transmit through the selecting windows; and
a two-dimensional light divider, located between said first and second masks, for two-dimensionally dividing incident light into two pairs of ±1st order lights,
wherein the two pairs of selecting windows in the second mask are arranged at a position where each of the two pairs of ±1st order lights passes through simultaneously and
wherein said measuring apparatus calculates optical performance of the target optical system from an interference fringe formed by a shearing interference between each measuring light that has passed the selecting windows.

2. A measuring apparatus according to claim 1, wherein the optical performance is a wave front aberration.

3. A measuring apparatus according to claim 1, wherein said measuring apparatus calculates the optical performance from wave front aberration of the target optical system with respect to two orthogonal directions, and
wherein the two pairs of selecting windows in the second mask allow ±1st order diffracted lights of the measuring light in the two orthogonal directions to simultaneously pass through the two pairs of selecting windows.

4. An exposure apparatus for exposing a pattern on a mask onto an object using light, said exposure apparatus comprising:
a projection optical system for projecting the pattern onto the object; and
a measuring apparatus according to claim 1 for detecting a wave front aberration of the projection optical system.

5. An exposure apparatus according to claim 4, wherein the light has a wavelength of 20 nm or less.

6. A device manufacturing method comprising the steps of:
exposing an object to be exposed using an exposure apparatus; and
developing the exposed object,
wherein said exposure apparatus includes:
a projection optical system for projecting the pattern onto the object; and
a measuring apparatus according to claim 1 for detecting a wave front aberration of the projection optical system.

7. A measuring apparatus according to claim 1, wherein each measuring light that has passed the two pairs of selecting windows has information regarding wave front aberration of the target optical system.

8. A measuring apparatus according to claim 1, wherein said measuring apparatus calculates the optical performance of the target optical system by Fourier-transforming the interference fringe.

* * * * *

UNITED STATES PATENT AND TRADEMARK OFFICE
CERTIFICATE OF CORRECTION

PATENT NO.       : 7,352,475 B2
APPLICATION NO.  : 10/994314
DATED            : April 1, 2008
INVENTOR(S)      : Masanobu Hasegawa It is certified that error appears in the above-identified patent and that said Letters Patent is hereby corrected as shown below:

ON THE COVER PAGE:
In item "(56) References Cited," on "Page 2," in the second column, under "OTHER PUBLICATIONS," in the first-listed document, the authors' name, "Naulieau, P. P., *et al.*," should read -- Naulleau, P. P., *et al.* --

COLUMN 2:
Line 25, "Kennet" should read -- Kenneth --.

COLUMN 5:
Line 2, "10 a" should read -- 10*a* --.
Line 17, "identically shaped" should read -- identically-shaped --.
Line 18, "identically shaped" should read -- identically-shaped --.

COLUMN 8:
Line 3, "pretreatment," should read -- pre-treatment, --.
Line 64, "simultaneously" should read -- simultaneously, --.

Signed and Sealed this

Twenty-first Day of October, 2008

JON W. DUDAS
*Director of the United States Patent and Trademark Office*